United States Patent [19]
Hughes

[11] Patent Number: 5,287,914
[45] Date of Patent: * Feb. 22, 1994

[54] SYSTEM FOR SUBSTRATE COOLING IN AN EVACUATED ENVIRONMENT

[75] Inventor: John L. Hughes, Rodeo, Calif.

[73] Assignee: Intevac, Inc., Santa Clara, Calif.

[ * ] Notice: The portion of the term of this patent subsequent to Jan. 26, 2010 has been disclaimed.

[21] Appl. No.: 980,680

[22] Filed: Nov. 24, 1992

Related U.S. Application Data

[63] Continuation of Ser. No. 763,355, Sep. 20, 1991, Pat. No. 5,181,556.

[51] Int. Cl.$^5$ .............................................. F28F 23/00
[52] U.S. Cl. ................................... 165/80.1; 165/80.2; 165/80.5; 165/104.33; 165/903; 165/185; 118/724
[58] Field of Search ............................ 165/80.1-80.5, 165/104.34, 104.33, 903, 185, 104.32; 118/724

[56] References Cited

U.S. PATENT DOCUMENTS

| | | | |
|---|---|---|---|
| 4,457,359 | 7/1984 | Holden | 165/80.5 |
| 4,512,391 | 4/1985 | Harra | 165/104.32 |
| 4,909,314 | 3/1990 | Lamont, Jr. | 165/80.3 |
| 4,969,511 | 11/1990 | Person | 165/104.34 |
| 5,113,929 | 5/1992 | Nabagawa et al. | 165/80.5 |
| 5,115,858 | 5/1992 | Fitch et al. | 165/80.5 |
| 5,181,556 | 1/1993 | Hughes | 165/80.5 |

*Primary Examiner*—Albert W. Davis, Jr.
*Attorney, Agent, or Firm*—Stanley Z. Cole

[57] ABSTRACT

A method and apparatus are disclosed using a combination of convection and conduction cooling to cool an article in an evacuated environment. A processing chamber is used which includes at least one heat sink. A flat surface of the article to be cooled is positioned within the chamber in a spaced apart facing parallel relationship to a facing surface of the heat sink. High conductivity gases are admitted into the chamber to accomplish cooling of the article.

8 Claims, 8 Drawing Sheets

SYSTEM FOR SUBSTRATE COOLING IN AN EVACUATED ENVIRONMENT

This is a continuation of copending application Ser. No. 07/763,355 filed Sep. 20, 1991 now U.S. Pat. No. 5,181,556 granted Jan. 26, 1993.

FIELD OF THE INVENTION

This invention relates to the art of processing thin substrates such as those for magnetic disks in high vacuum systems where control of substrate temperature is difficult to achieve. More particularly, the invention relates to a system for cooling substrates in an evacuated environment for purposes such as preparation for a subsequent coating, exit to the atmosphere, or protection against excessive temperature increases.

BACKGROUND OF THE INVENTION

Thin substrates, such as those used for magnetic disks, require high vacuum processing. This processing generally involves heating of the substrate to a desired temperature and applying different coatings by sputtering or similar physical vapor deposition processes. The high vacuum processes facilitate very high purity coating depositions and the achievement of a variety of properties that are controlled by such parameters as background pressure, coating rate, and substrate temperature. Illustrative is the substrate handling and processing system disclosed in co-pending application Ser. No. 07/763,183, filed Sep. 20, 1991 now U.S. Pat. No. 5,215,420.

Control of substrate temperature in an evacuated environment (i.e. vacuum) is an essential, but difficult task. Typically, heating of a substrate is done by radiation transfer from such devices as quartz lamps. However, normal heat conduction processes work very poorly in the vacuum environment. The atmosphere is not present to supply an ambient environment around the heat sink.

During substrate (or disk) processing, it is also often desirable to lower the substrate temperature. For example, controlled cooling of the substrate may be necessary to achieve a predetermined temperature for a serial coating step, such as chromium, cobalt alloy or carbon layers with magnetic disks. In this instance, the properties of the high hardness, abrasion resistant carbon coatings are enhanced when deposited onto a substrate which is at a relatively low temperature.

Further, cooling of substrates or disks by exposure to the atmosphere while still hot may severely limit the usefulness of such substrates or disks for particular applications. Additionally, uncontrolled cooling and/or cooling in atmosphere could adversely effect coating quality by virtue of the diffusion of different coatings at elevated temperature.

Several prior art techniques have been employed in an attempt to cool the relatively thin substrates during processing. Illustrative is the apparatus disclosed in U.S. Pat. No. 4,909,314. The system disclosed in the noted patent includes a heat exchanging body which is designed and configured to be in contact with the article to be cooled. The system also employs a relatively low conductivity gas, such as argon, to facilitate the heat exchange between the article and the heat exchanging body.

The main disadvantage of such a system is that the act of touching such a relatively thin substrate may do harm to one or more surfaces that have to be maintained in pristine condition. Further, the low mass and the need to handle the substrates only at the edges make them difficult to conductively couple with a heat sink.

Accordingly, it is an object of the invention to provide an improved method for substrate cooling in a vacuum environment which could be employed between process starting steps and not harm the substrate surface of coatings already deposited.

It is a further object of the invention to provide a system for cooling a substrate in a vacuum environment with an enhanced cooling rate so that commercially viable processes could be effected.

SUMMARY OF THE INVENTION

The disclosed system for cooling a substrate in an evacuated environment eliminates the disadvantages and shortcomings associated with the prior art techniques. The disclosed system employs conduction/convection heat transfer in a specialized process chamber to cool thin substrates rapidly without any contact to either surface. A cooling chamber is provided with stationary heat sinks spaced a predetermined distance apart, between which the substrate is positioned. A high thermal conductivity gas is then introduced, filling the entire chamber to the desired operating pressure. The substrate is then cooled to a given temperature, depending on the heat sink temperature, original substrate temperature, gas thermal conductivity, pressure, and spacing between the substrate and heat sinks.

BRIEF DESCRIPTION OF THE DRAWINGS

Further features and advantages will become apparent from the following and more particular description of the preferred embodiment of the invention, as illustrated in the accompanying drawings, in which like referenced characters generally referred to the parts or elements throughout the views, in which.

DETAILED DESCRIPTION OF THE INVENTION

In accordance with the present invention, the disclosed system for cooling a substrate in an evacuated environment substantially reduces or eliminates the disadvantages and shortcomings associated with the prior art techniques. According to the invention, a cooling chamber is provided with a pair of stationary heat sinks having substantially planar parallel facing surfaces. Once the substrate is operatively positioned between the heat sinks, with its respective outer surfaces adjacent to and substantially parallel with the facing surfaces of the heat sinks, a high thermal conductivity gas is introduced into the cooling chamber to facilitate the heat transfer from the substrate to the heat sinks. A highly important technical advantage of the invention is that the contiguous surfaces of the heat sinks are maintained at a predetermined close spacing with the substrate to achieve a substantial conductive/convective heat transfer and eliminating the risk of any damage to the extremely sensitive surface of the substrate or disk by heat sink contact.

Figure 2:
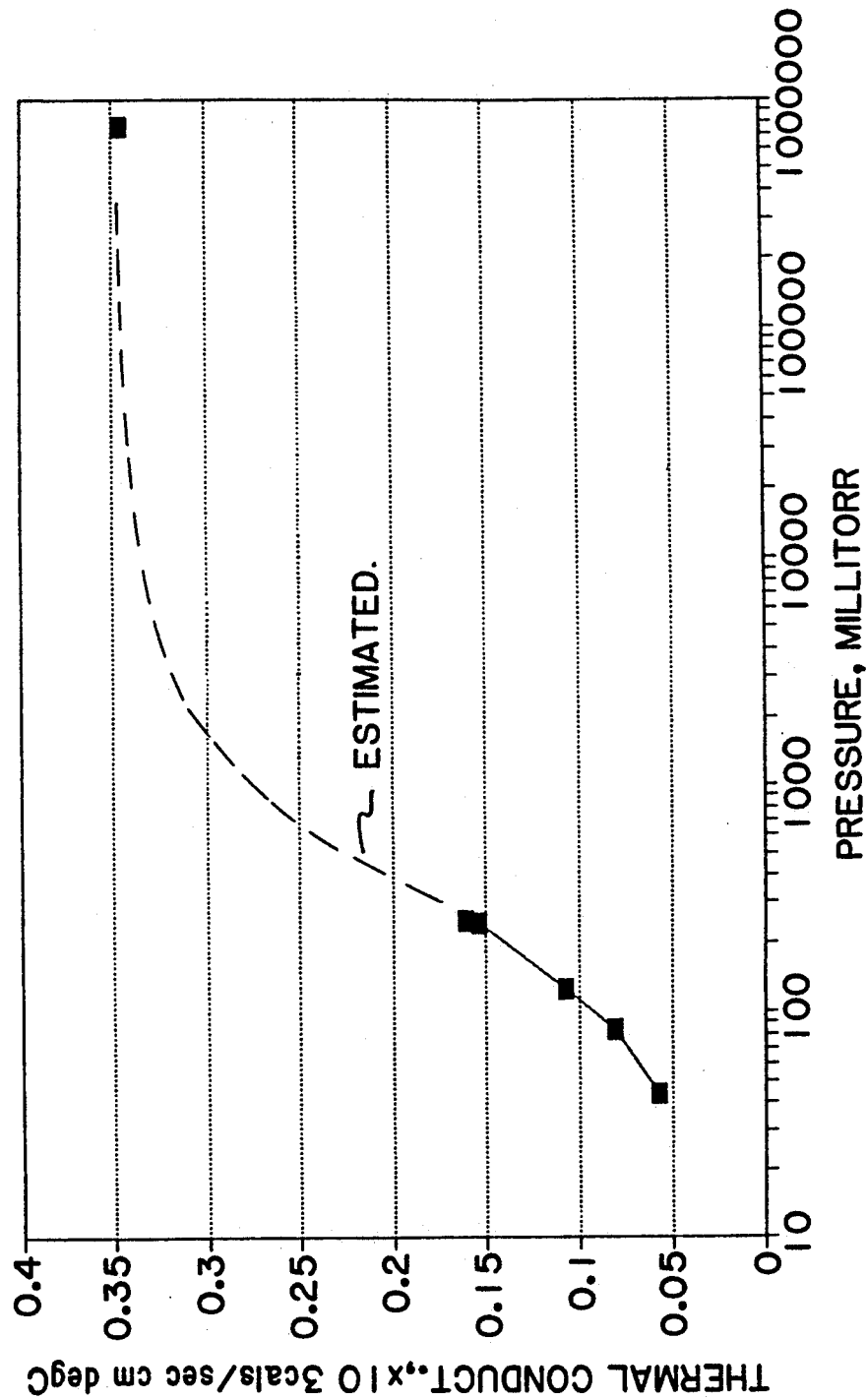
FIG. 2 is a graph illustrating the thermal conductivity versus pressure for helium.
Figure 3:
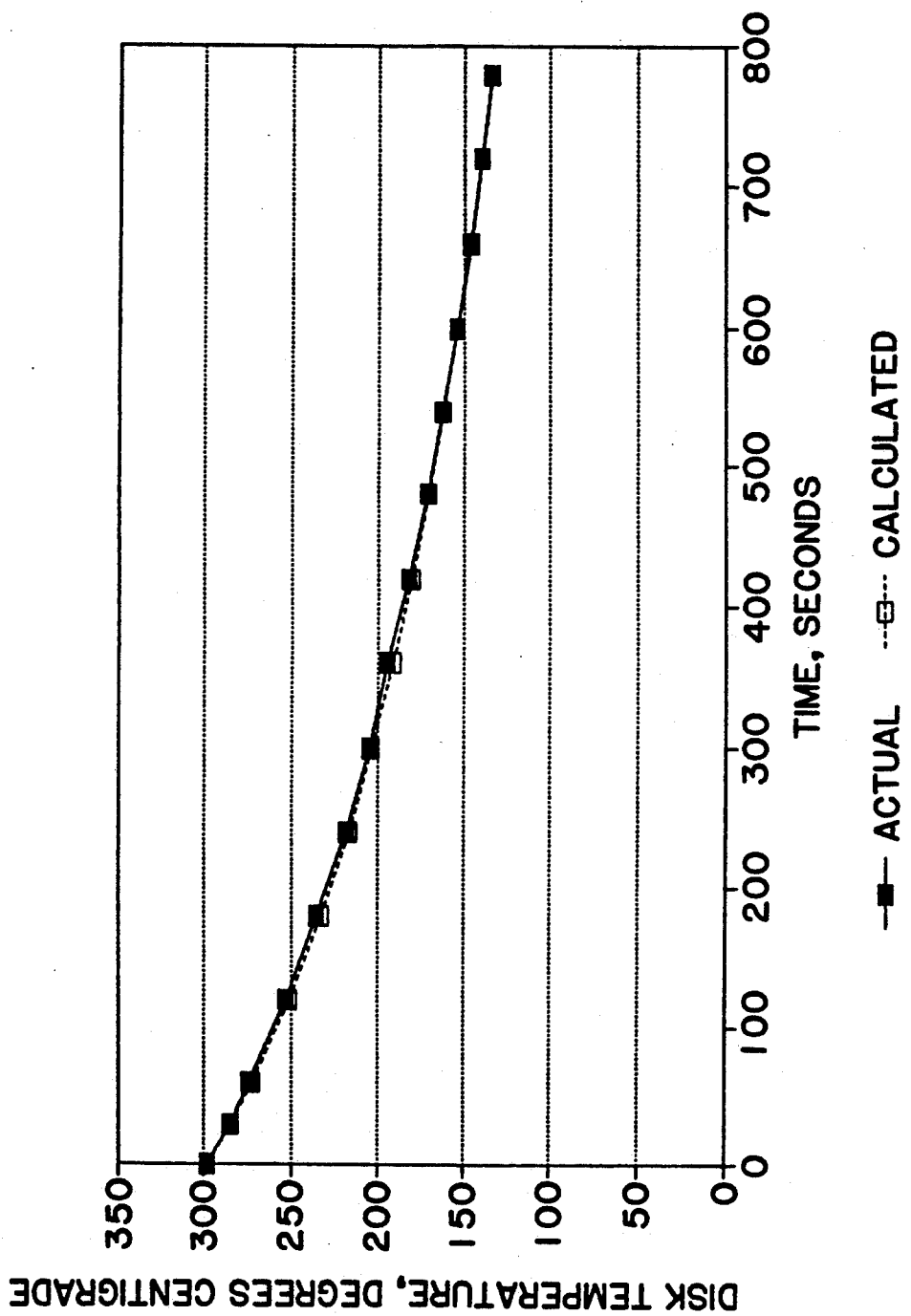
FIGS. 3 through 8 are graphs illustrating the cool down rates of substrates under varying processing conditions according to the invention.

Gas conduction cooling can be viewed with a simple model as per the following:

$$\frac{\Delta E}{\Delta t} = K\left(\frac{\Delta \phi}{L}\right)$$

where
ΔE=Energy removed from the disk
Δt=time increment
K=gas thermal conductivity
Δϕ=temperature difference between substrate and heat sink
L=spacing between substrate and heat sink For most gases, the thermal conductivity K is constant at pressures of one atmosphere and higher, with little or no dependency on the pressure. As the pressure falls below an atmosphere, the conductivity is reduced. The conductivity of the various gases is related to their molecular weight, with the lightest gases, such as helium and hydrogen, being the best conductors. FIG. 2 graphically illustrates the conductivity versus pressure for helium, as determined by recent experiments.

In designing a processing station to give the highest substrate cooling rate, it is important to choose a gas such as helium or hydrogen for best conductivity. Further, it is necessary to maintain the heat sinks at the lowest practical temperature to provide the highest temperature difference between the sinks and the substrate. It is also desirable to maintain the spacing between the heat sinks and the substrate at a practical minimum such that the substrates can be easily and readily positioned in and out of the processing station as the substrate is sequentially processed in a vacuum system such as disclosed in co-pending application Ser. No. 07/763,183, filed Sep. 20, 1991 now U.S. Pat. No. 5,215,420. This is a compromise spacing where undesirable contact with the substrate surfaces is avoided, but heat transfer from the substrate to the heat sinks is maximized.

Finally, the gas pressure of the processing station must be controlled to optimize conductivity at the highest practical value consistent with the vacuum system operation. This is typically done by throttling the gas flow to a high vacuum pump such that a small (total) gas flow gives a greatly elevated pressure.

Figure 1:
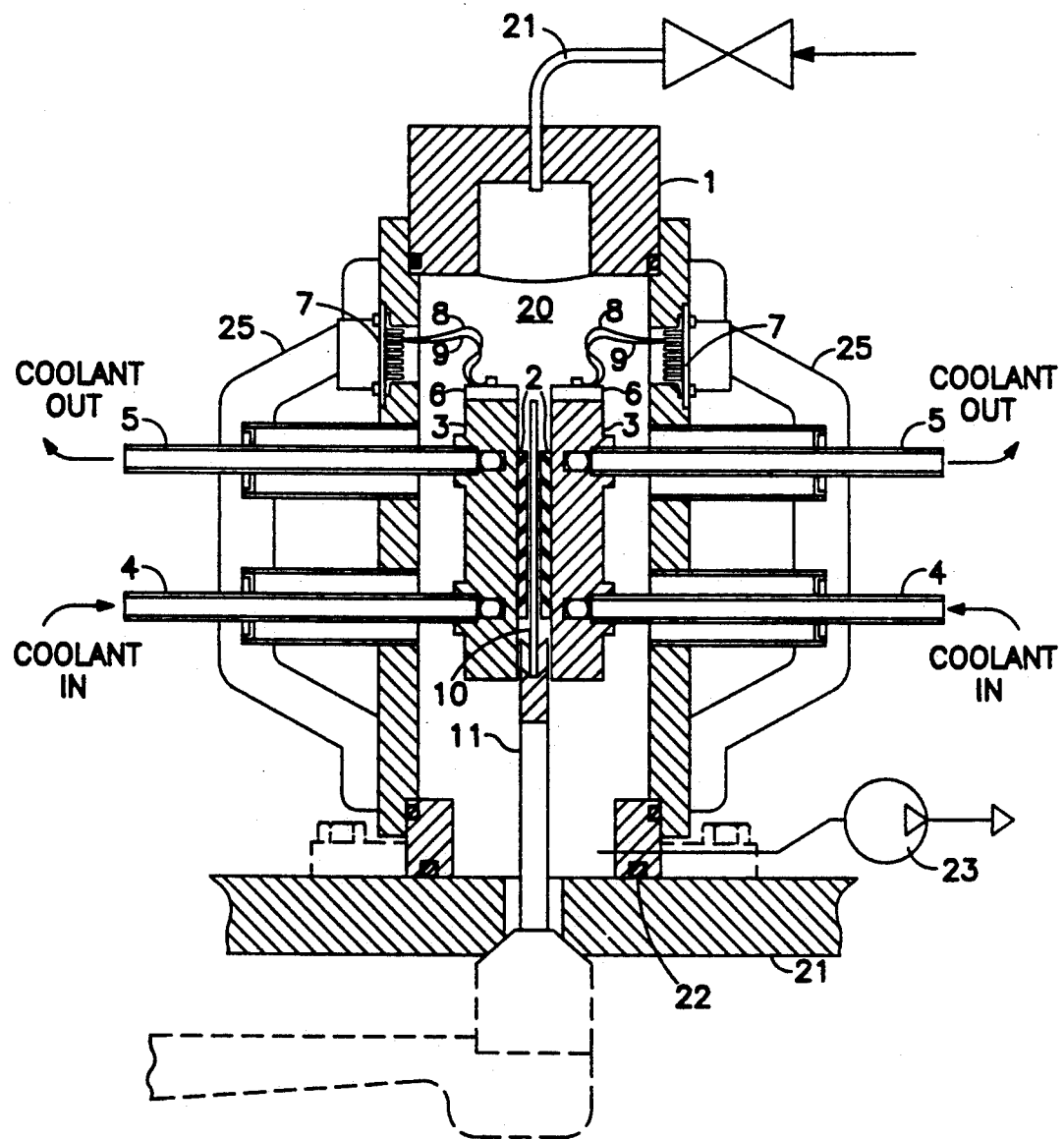
FIG. 1 is a cross-sectional view of the substrate cooling system within the substrate processing chamber according to the invention.

FIG. 1 is a simplified sectional view of one embodiment of the present invention. In the preferred embodiment of the invention, the substrate cooling station 1 is operatively secured to the main vacuum chamber housing 21 by conventional mounting means, such as the plurality of bolts shown in phantom, and is effectively sealed thereto by virtue of O-ring seal 22.

The substrate cooling station 1 generally comprises two heat sink spacers 2 mounted on a pair of heat sinks 3. The heat sink spacers 2 are employed to conveniently set and maintain the critical spacing between the substrate 10 and the heat sinks 3. To maintain the temperature of heat sinks 3 at a suitably low value, conduits 4 and 5 passing into and through the heat sinks 3 are provided to allow a conventional coolant to be flowed into and out of the heat sinks 3, thereby maintaining the temperature of the heat sinks 3 at the desired level.

Temperature of the heat sinks 3 is monitored by virtue of a pair of conventional temperature sensors 6, operatively mounted on each heat sink 3, and a pair of conventional temperature sensor vacuum feedthroughs 7 operatively positioned in the processing chamber 1 housing. The temperature sensors 6 and feedthroughs 7 are operatively connected by leads 8, 9.

In the preferred embodiment, the heat sinks 3 have a generally planar surface and are generally positioned parallel one to the other. The heat sink spacers 2 are tightly mounted to the heat sinks 3 to ensure that they are both at the same temperature. The surfaces of the heat sink spacers 2 are closely spaced to achieve a substantial convective/conductive heat transfer from the substrate 10 to the heat sinks 3, but not in contact with the substrate 10 when positioned therein, eliminating any risk of damage to the delicate substrate 10 surfaces. The term substantial convective/conductive heat transfer, as used herein, means a convective/conduction heat transfer in excess of 500% of the optimum heat transfer from the substrate 10 to the heat sinks 3 by radiation alone.

An input gas conduit 21 is provided to introduce the high thermal conductivity gas, such as helium, directly into the processing chamber 20. The introduction of helium gas increases the rate of cooling by increasing the rate of heat transfer from the substrate 10 to the heat sinks 3.

In the preferred embodiment of the invention, the heat sinks 3 comprise a high conductivity material such as copper, and are capable of cryogenic operation at approximately −130° C. Each of the heat sink spacers 2 are also maintained at a predetermined distance from the respective substrate 10 surface between 0.05 and 0.25 inches, preferably 0.09 inches.

In the preferred embodiment, helium gas is employed as the conductive medium. The helium gas is introduced into the processing chamber by conduit 21 and pumped through a very small orifice or throttle plate (not shown) to a conventional high vacuum cryopump 23 mounted near the base of the processing station 1.

The substrate 10 is moved into and out of the processing station, and loosely supported therein, on a substrate holder 11, such as that disclosed in co-pending application U.S. Ser. No. 1/763,183, filed Sep. 20, 1991 now U.S. Pat. No. 5,215,420, whereby neither of the two coated surfaces of the substrate are touched by any part of the apparatus.

The substrate cooling station 1 may also include a pair of external handles 25 to facilitate removal and installation of the cooling station 1.

According to the method of the present invention, to effect cooling of the substrate 10, each of the heat sinks 3 is prepositioned (i.e. spaced) between 0.05 and 0.25 inches, preferably 0.09 inches from the substrate 10. The heat sinks 3 are then cooled to between −50° C. and −200° C., preferably −130° C. by conventional cryogenic refrigeration.

The substrate 10 is then positioned in the processing chamber 20 by the substrate holder 11 such that the respective outer surfaces of the substrate 10 are adjacent to and substantially parallel with the facing surfaces of the heat sink spacers 2. A high thermal conductivity gas, such as helium or hydrogen is introduced into the processing chamber 20 while the heat sinks 3 are at their operating temperatures to increase the rate of heat transfer from the substrate 10 to the heat sinks 3. The gas flow is introduced and maintained at a pressure significantly above that of the processing chamber 20, yet substantially below that of the atmosphere. In the preferred embodiment the gas pressure is maintained at approximately 1 to 100 Torr, preferably 10 Torr. To stop the substrate 10 cooling, the gas flow is stopped and the throttle plate orifice (not shown) is opened.

Another method which may be used to cool the substrate 10 is to completely close off the high vacuum pumping port (not shown) and admit enough gas for effective conduction. This involves only an initial gas flow which is then stopped when the operating pressure is reached. To stop the cooling, the high vacuum valve is then opened and the relatively small net amount of gas is pumped away, restoring high vacuum in the processing chamber 20.

After cooling the substrate 10 to a predetermined temperature, the substrate 10 is removed from the processing chamber 10 by the substrate holder 11.

The controls and examples which follow illustrate the superior performance of the invention. The controls and examples are for illustrative purposes only and are not meant to limit the scope of the claims in any way.

CONTROLS AND EXAMPLES

A 95 mm. dia.×0.050" thk. un-coated (except for electroless nickel) aluminum disk was employed for the following experimental analysis. The disk was placed in a V-block and preheated to 300° C. The disk was equipped with a conventional thermocouple to closely monitor the disk temperature. The spacing between disk and each heat sink spacer was maintained at 0.225".

Figure 4:
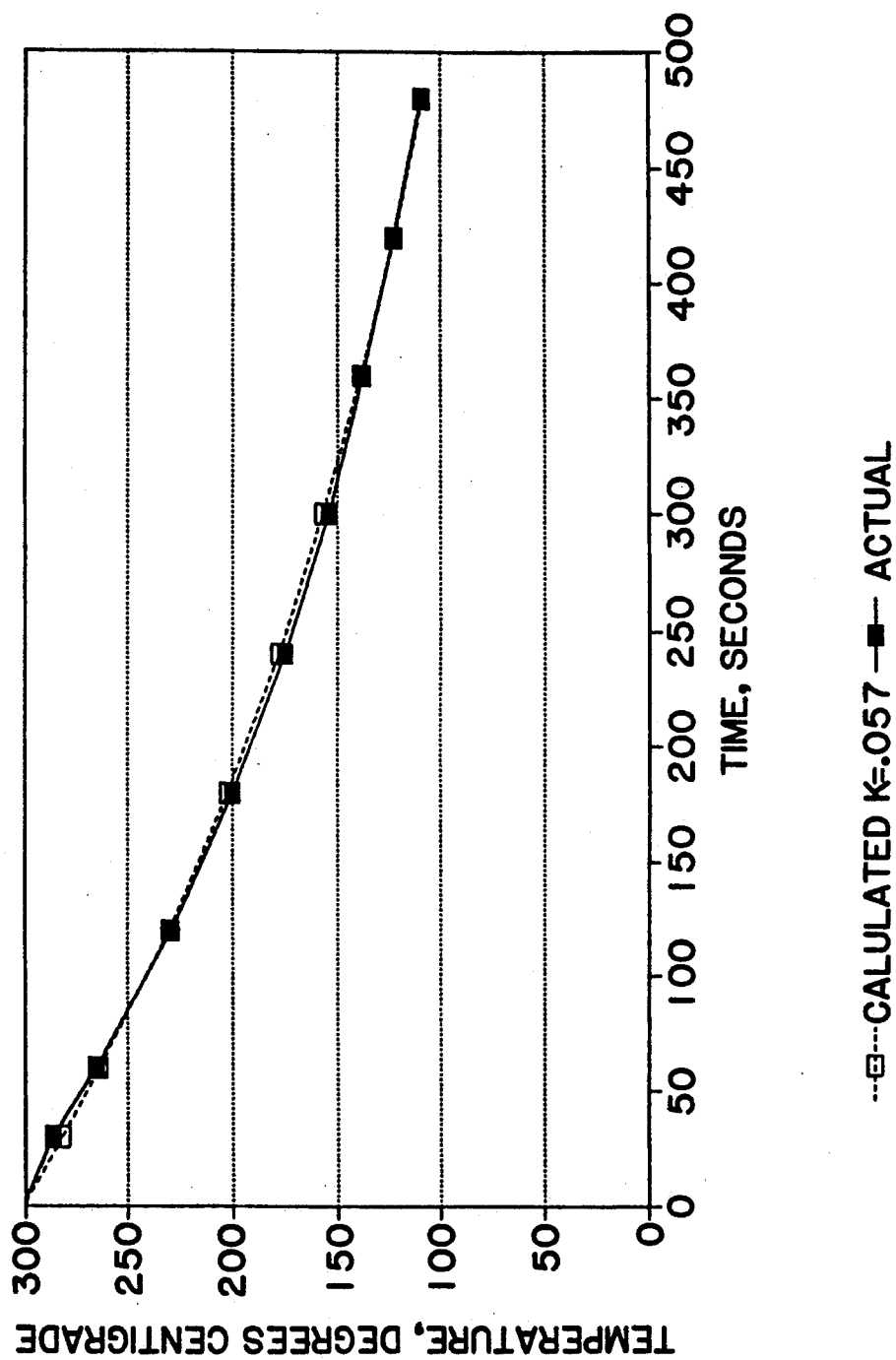
Figure 5:
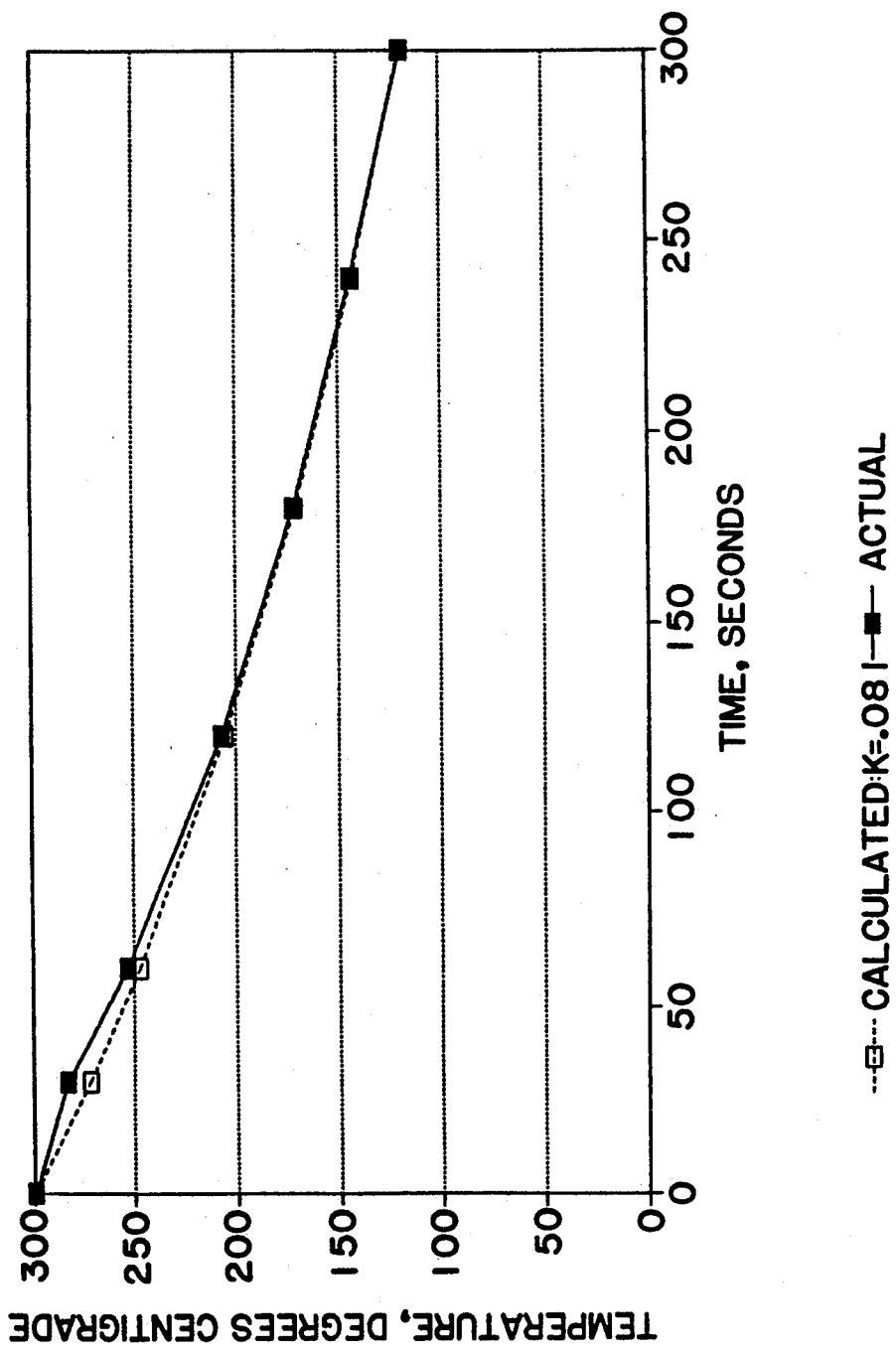
Figure 6:
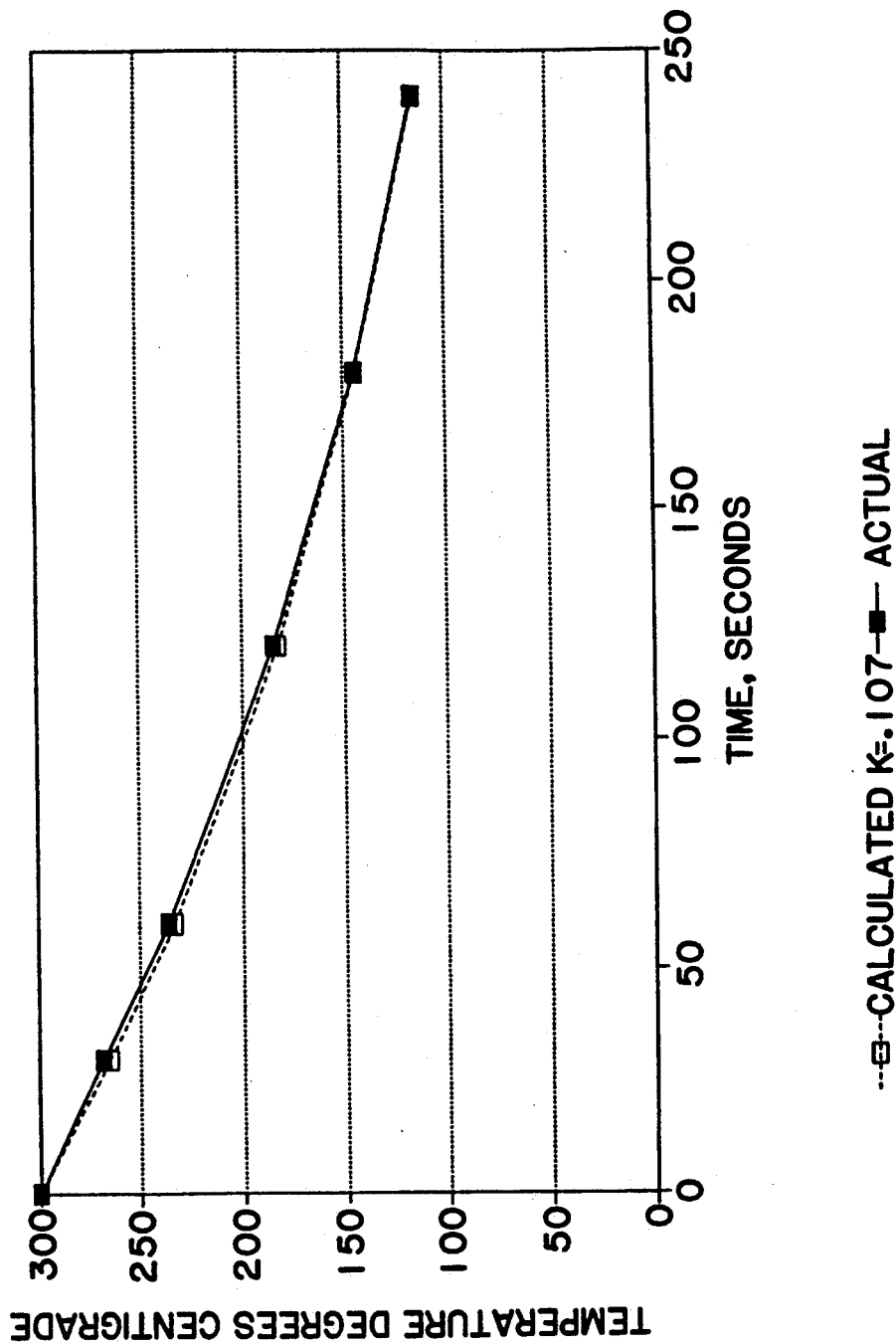
Figure 7:
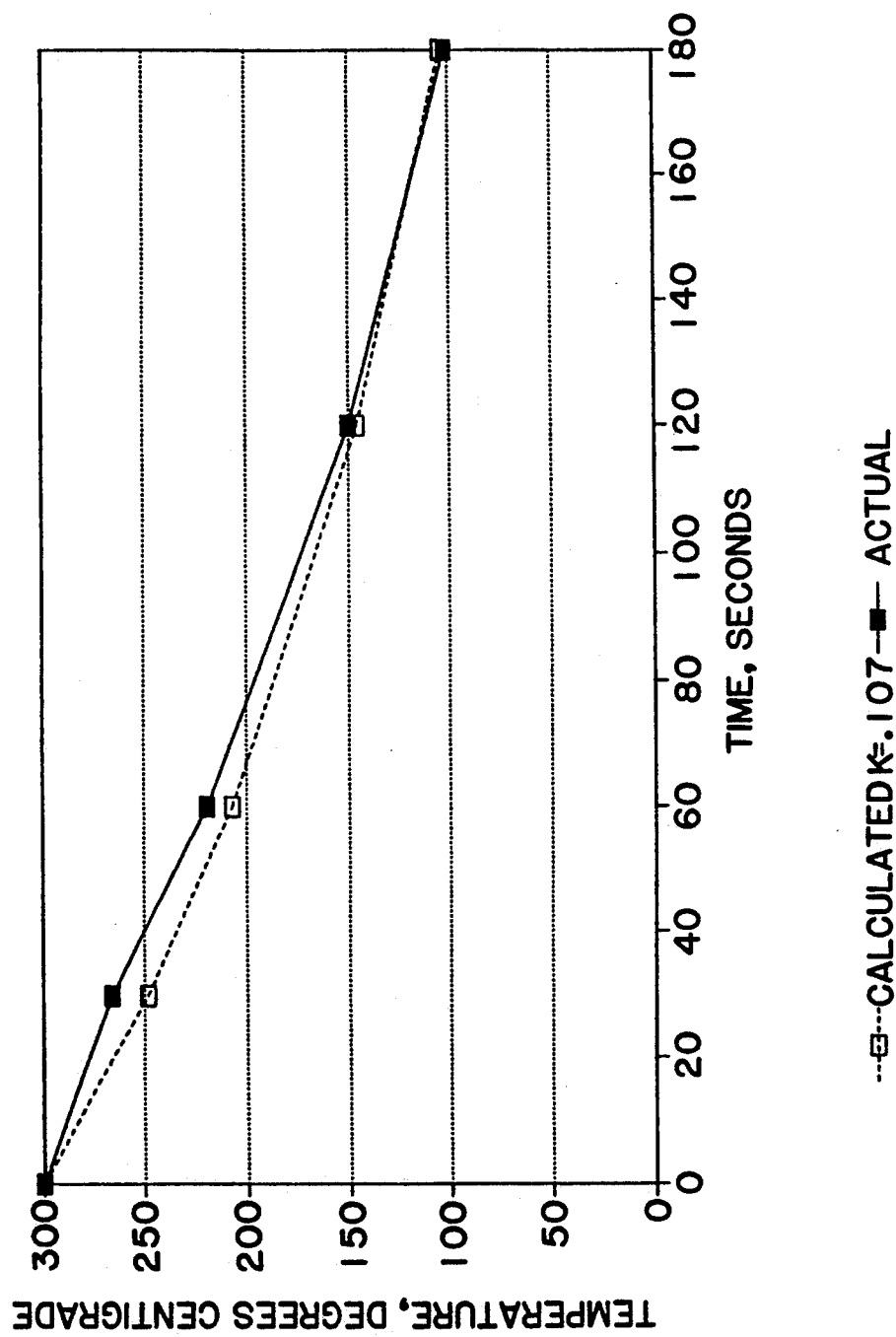

In the first experiment, the cooling rate was measured without conductive helium present. This experiment thus measured the cooling rate due to radiation only and is shown in FIG. 4.

Figure 8:
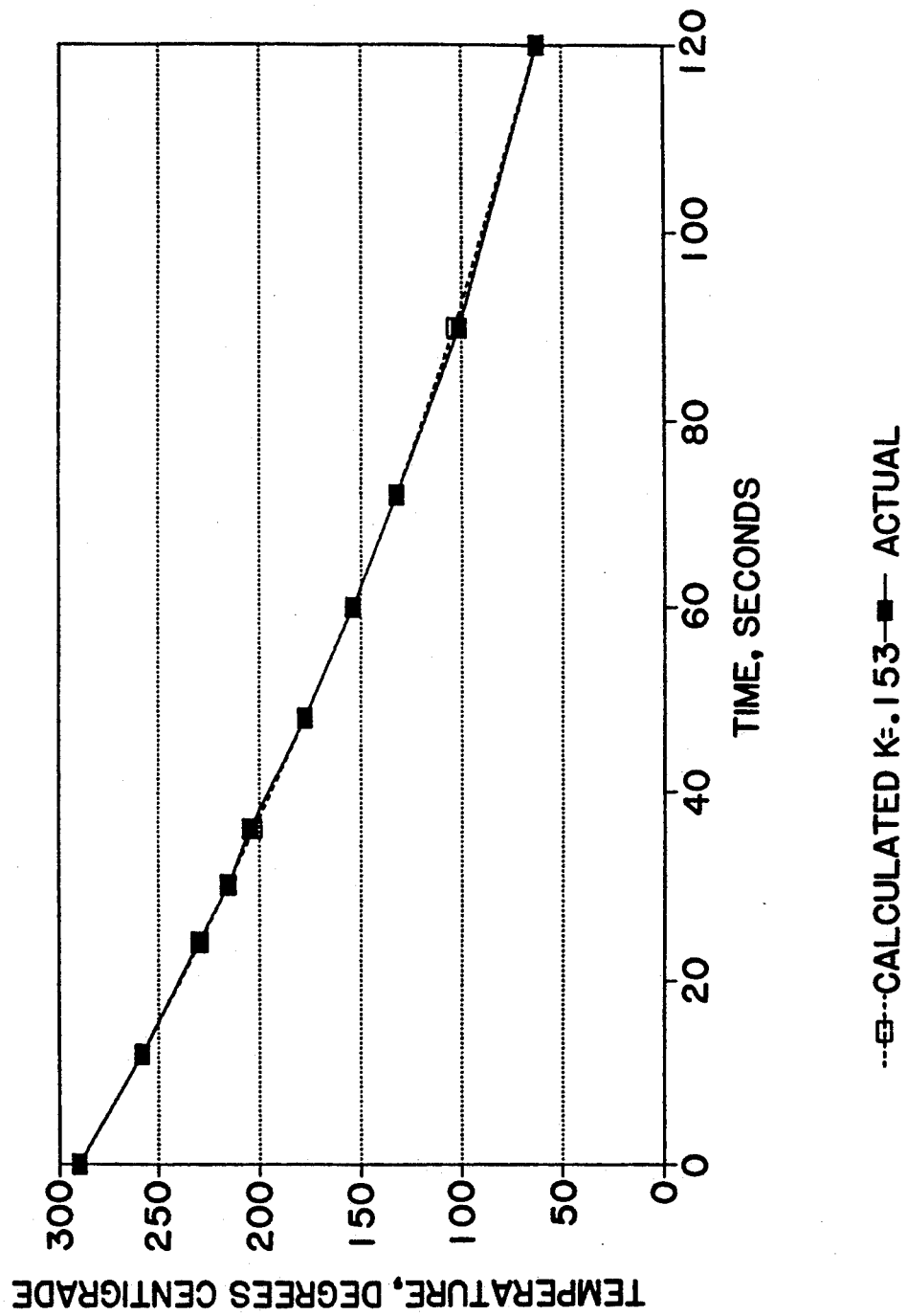

Similar cooldown experiments were then repeated at various helium pressures, as shown in FIGS. 4, 5, 6 and 7, with the heat sink temperature maintained at 21° C. using cooling water. FIG. 8 illustrates the enhanced cooling rate which was achieved using cryogenic heat sinks at −130° C. The results of the above experiments are summarized in Table 1.

TABLE 1

| Pressure | Heat Sink Temp °C. | Time to Reach 150° C. From 300° C. Initial Temp. |
|---|---|---|
| High vacuum | 21° C. | 625 sec. |
| 44.4 mtorr | 21° C. | 315 sec. |
| 84.0 | 21° C. | 227 sec. |
| 125.8 | 21° C. | 195 sec. |
| 251 | 23° C. | 120 sec. |
| 242 | −130° C. | 62 sec. |

The foregoing examples have set forth a substrate cooling system which effectively cools a substrate or disk during processing without any risk of damage to the delicate surfaces of the substrate or disk. This is accomplished by positioning a pair of heat sinks at a predetermined spacing such that the substrate or disk may be easily and readily positioned between the sinks, but close enough in spacing to achieve a substantial conductive/convective heat transfer from the substrate to the heat sinks with the aid of a high conductivity gas.

While the embodiments of the substrate cooling apparatus and methods have been disclosed with reference to specific structures, one of ordinary skill can make various changes and modifications to the invention to adapt it to various uses and conditions. As such, these changes and modifications and properly, equitably, and intended to be, within the full range of equivalents of the following claims.

What is claimed is:

1. An apparatus for temperature control of an article having opposite substantially planar outer surfaces in an evacuated environment, comprising:
   a heat exchanging structure, said structure having at least a stationary heat sink having a substantially planar surface disposed within a vacuum chamber;
   transfer means for moving the article into and out of a position with an outer surface thereof adjacent to and substantially parallel with said planar surface of said heat sink;
   said heat sink being spaced a predetermined distance apart from an article which distances sufficient to permit the positioning and removal of said article from a parallel relationship with the surface of the heat sink without contacting said heat sink;
   said predetermined distance being further selected to permit a substantial convective/conductive heat transfer between said article and said heat sink; and
   means for providing a high conductivity gas between said heat sink and said article at a pressure significantly above that of said vacuum chamber, yet substantially below that of the atmosphere.

2. The apparatus of claim 1 wherein said predetermined distance from said facing surface of said heat sink to said facing surface of said article is generally between 0.05 to 0.25 in.

3. The apparatus of claim 1 wherein said heat sink includes means for cooling said heat sink.

4. A method for temperature control of an article having opposite substantially planar outer surfaces in an evacuated environment, comprising:
   spacing a heat sink having a substantially planar outer surface in a parallel and facing relationship with an outer surface of said article, said heat sink being operatively mounted within a processing chamber adapted to operate at a pressure substantially less than atmospheric pressure;
   placing the article without contacting the heat sink a predetermined distance apart and in a parallel relationship with said heat sink, said article being positioned close enough to permit a substantial convective/conductive heat transfer from between said article and said heat sink;
   controlling the temperature of said heat sink to a predetermined cold level compared to the wafter;
   introducing a high thermal conductivity gas between said heat sink and said article at a pressure significantly above that of said processing chamber, yet substantially below that of atmosphere to facilitate the heat between said substrate and said heat sink; and
   removing said article from said processing chamber after said article attains a predetermined temperature.

5. The method of claim 4 wherein said predetermined distance from said facing surfaces of said heat sink to said facing surface of said article is generally between 0.05 to 0.25 in.

6. The method of claim 4 wherein said heat sink is precooled to a temperature in the range of approximately −50° C. to −200° C.

7. The method of claim 4 wherein said high thermal conductivity gas is selected from the group consisting of helium and hydrogen.

8. The method of claim 4 wherein said high thermal conductivity gas pressure is maintained in the range of approximately 1 to 10 Torr.

* * * * *

UNITED STATES PATENT AND TRADEMARK OFFICE
CERTIFICATE OF CORRECTION

PATENT NO. : 5,287,914
DATED : Feb. 22, 1994
INVENTOR(S) : John L. Hughes

It is certified that error appears in the above-indentified patent and that said Letters Patent is hereby corrected as shown below:

Column 5, line 66, Change "and" to --are--.
Column 6, line 13, Change "distances" to --distance is--.
Column 6, line 45, Change "wafter" to --article--.
Column 6, line 50, After first occurrence of "heat" insert --transfer--.
Column 6, line 50, Change "substrate" to --article--.

Signed and Sealed this

Twenty-seventh Day of August, 1996

Attest:

BRUCE LEHMAN

Attesting Officer     Commissioner of Patents and Trademarks

(12) EX PARTE REEXAMINATION CERTIFICATE (6256th)
United States Patent
Hughes

(10) Number: US 5,287,914 C1
(45) Certificate Issued: Jun. 17, 2008

(54) SYSTEM FOR SUBSTRATE COOLING IN AN EVACUATED ENVIRONMENT

(75) Inventor: John L. Hughes, Rodeo, CA (US)

(73) Assignee: Intevac, Inc., Santa Clara, CA (US)

Reexamination Request:
No. 90/004,396, Sep. 30, 1996

Reexamination Certificate for:
Patent No.: 5,287,914
Issued: Feb. 22, 1994
Appl. No.: 07/980,680
Filed: Nov. 24, 1992

Certificate of Correction issued Aug. 27, 1996.

Related U.S. Application Data

(63) Continuation of application No. 07/763,355, filed on Sep. 20, 1991, now Pat. No. 5,181,556.

(51) Int. Cl.
*B01J 3/00* (2006.01)
*G05D 23/19* (2006.01)
*C23C 14/54* (2006.01)

(52) U.S. Cl. .......................... 165/80.1; 165/104.33; 165/185; 165/80.2; 165/80.5; 165/903; 118/724

(58) Field of Classification Search .............. 165/80.1, 165/80.2, 80.5, 104.33, 903, 185, 80.3, 80.4, 165/104.34, 104.32; 118/724; 204/298, 298.09, 204/298.25, 192.24; 148/1.5; 279/4; 901/32; 414/217; 156/643, 657; 505/476
See application file for complete search history.

(56) References Cited

U.S. PATENT DOCUMENTS

| 3,294,670 A | * | 12/1966 | Charschan et al. .... 204/298.25 |
| 3,993,123 A | | 11/1976 | Chu et al. |
| 4,183,797 A | * | 1/1980 | Kennedy et al. |
| 4,261,762 A | | 4/1981 | King |
| 4,306,731 A | * | 12/1981 | Shaw ........................... 279/4 |
| 4,311,427 A | * | 1/1982 | Coad et al. |
| 4,457,359 A | * | 7/1984 | Holden |
| 4,500,407 A | * | 2/1985 | Boys et al. |
| 4,528,211 A | * | 7/1985 | Bhagat ....................... 156/657 |
| 4,558,388 A | * | 12/1985 | Graves, Jr. ............. 204/298.25 |
| 4,680,061 A | * | 7/1987 | Lamont, Jr. .................. 148/1.5 |
| 4,741,799 A | * | 5/1988 | Chen et al. ................. 156/643 |
| 4,749,465 A | * | 6/1988 | Flint et al. ............. 204/298.25 |
| 4,756,815 A | * | 7/1988 | Turner et al. ................ 204/298 |
| 4,909,314 A | * | 3/1990 | Lamont, Jr. ................. 165/80.3 |
| 4,981,408 A | * | 1/1991 | Hughes et al. |
| 5,024,747 A | * | 6/1991 | Turner et al. .......... 204/298.09 |
| 5,100,285 A | * | 3/1992 | Wagner ....................... 901/32 |
| 5,180,708 A | * | 1/1993 | Harada et al. ......... 204/192.24 |
| 5,199,483 A | * | 4/1993 | Bahng ....................... 165/80.1 |
| 5,215,420 A | * | 6/1993 | Hughes et al. |
| 5,679,625 A | * | 10/1997 | Ito et al. ..................... 505/476 |

FOREIGN PATENT DOCUMENTS

| GB | 2137664 | * | 10/1984 | ............. 204/298.09 |
| JP | 2-106297 | * | 4/1990 | ................. 414/217 |

OTHER PUBLICATIONS

Barber, G.F.; "Two–Chamber Air–to–Vacuum Lock System" IBM Technical Disclosure Bulletin, vol. II, No. 7, Dec. 1968 pp. 757–758.*

M. King and P. H. Rose, "Experiments on Gas Cooling of Waters," Proceedings of the Third International Conference on Ion Implantation Equipment and Techniques, Queen's University, Kingston, Ontario (Jul. 8–11, 1980).

(Continued)

*Primary Examiner*—John K. Ford

(57) ABSTRACT

A method and apparatus are disclosed using a combination of convection and conduction cooling to cool an article in an evacuated environment. A processing chamber is used which includes at least one heat sink. A flat surface of the article to be cooled is positioned within the chamber in a spaced apart facing parallel relationship to a facing surface of the heat sink. High conductivity gases are admitted into the chamber to accomplish cooling of the article.

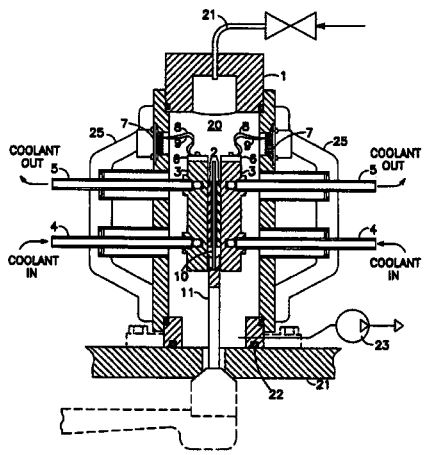

OTHER PUBLICATIONS

Cuomo, "Heat Transfer Process for High Thermal Input Processes" IBM Technical Disclosure Bulletin, vol. 21, No. 2, pp. 840–841 (Jul. 1978).

Hammer, "Cooling Ion–Implantation Target," IBM Technical Disclosure Bulletin, vol. 19, No. 6, pp. 2270–2271 (Nov. 1976).

* cited by examiner

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claim 1–8 are cancelled.

* * * * *